(12) United States Patent
Fan

(10) Patent No.: US 11,342,421 B1
(45) Date of Patent: May 24, 2022

(54) RECESSED ACCESS DEVICE AND MANUFACTURING METHOD THEREOF

(71) Applicant: NANYA TECHNOLOGY CORPORATION, New Taipei (TW)

(72) Inventor: Kung-Ming Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/167,067

(22) Filed: Feb. 3, 2021

(51) Int. Cl.
*H01L 29/40* (2006.01)
*H01L 29/423* (2006.01)
*H01L 29/66* (2006.01)

(52) U.S. Cl.
CPC ........ *H01L 29/401* (2013.01); *H01L 29/4236* (2013.01); *H01L 29/66621* (2013.01)

(58) Field of Classification Search
CPC ....... H01L 29/40; H01L 29/66; H01L 29/401; H01L 29/423; H01L 29/4236; H01L 29/42336; H01L 29/42352; H01L 29/1037; H01L 29/66704; H01L 29/66734; H01L 29/66477; H01L 29/66954; H01L 29/4232; H01L 29/1079; H01L 27/10829; H01L 27/10823; H01L 21/76224; H01L 21/76235

USPC .......................................................... 438/197
See application file for complete search history.

(56) References Cited

U.S. PATENT DOCUMENTS

| | | | |
|---|---|---|---|
| 2004/0075134 A1* | 4/2004 | Lin ................ | H01L 29/66825 257/E21.422 |
| 2009/0173994 A1 | 7/2009 | Min et al. | |
| 2011/0159653 A1* | 6/2011 | Ikeda .............. | H01L 27/1104 257/E21.625 |
| 2014/0213027 A1* | 7/2014 | Wu ................ | H01L 29/66666 438/272 |

* cited by examiner

*Primary Examiner* — Chuong A Luu
(74) *Attorney, Agent, or Firm* — CKC & Partners Co., LLC

(57) ABSTRACT

A method of manufacturing a recessed access device includes the following operations. A first trench is formed in a substrate. A first gate oxide layer is formed on an inner surface of the first trench. A sacrificial layer is formed in a bottom of the first trench, in which a portion of the first gate oxide layer above the sacrificial layer is exposed from the first trench. The portion of the first gate oxide layer is removed to expose a sidewall of the first trench. The sidewall of the first trench is oxidized to form a second gate oxide layer within the substrate, in which the second gate oxide layer is in contact with the first gate oxide layer. The sacrificial layer is removed to form a second trench.

9 Claims, 12 Drawing Sheets

RECESSED ACCESS DEVICE AND MANUFACTURING METHOD THEREOF

BACKGROUND

Field of Invention

The present invention relates to a recessed access device and a manufacturing method thereof.

Description of Related Art

With the development of semiconductor technology, the dimensions of semiconductor devices have been shrinking. The techniques of high density of transistors and transistors with shorter channel lengths are highly demanded to increase the operating speed and the performance of the devices. However, the shorter channels lengths have the problem of short channel effects, which limit the performance of the devices.

Metal gate recessed access devices (RADs) for dynamic random access memory (DRAM) have been demonstrated to avoid short channel effects. However, gate induced drain leakage (GIDL) may occur between the gate layer and the source/drain region in the semiconductor devices. Therefore, there is a need for a novel recessed access device technique to overcome the problem mentioned above.

SUMMARY

One aspect of the present disclosure is to provide a method of manufacturing a recessed access device. The method includes the following operations. A first trench is formed in a substrate. A first gate oxide layer is formed on an inner surface of the first trench. A sacrificial layer is formed in a bottom of the first trench, in which a portion of the first gate oxide layer above the sacrificial layer is exposed from the first trench. The portion of the first gate oxide layer is removed to expose a sidewall of the first trench. The sidewall of the first trench is oxidized to form a second gate oxide layer within the substrate, in which the second gate oxide layer is in contact with the first gate oxide layer. The sacrificial layer is removed to form a second trench. A gate layer is formed in a bottom of the second trench. A source/drain region is formed in the substrate and adjacent to the gate layer.

According to some embodiments of the present disclosure, forming the first gate oxide layer on the inner surface of the first trench is performed by a deposition process.

According to some embodiments of the present disclosure, forming the first gate oxide layer on the inner surface of the first trench is performed by a thermal oxidation process to oxidize the inner surface of the first trench.

According to some embodiments of the present disclosure, a material of the sacrificial layer is nitride.

According to some embodiments of the present disclosure, forming the gate layer in the bottom of the second trench includes the following operations. The gate layer is formed on the first gate oxide layer and the second gate oxide layer. An etch back process is performed to remove a portion of the gate layer.

According to some embodiments of the present disclosure, the method further includes a dielectric layer is formed on the gate layer in the second trench, after the gate layer is formed in the bottom of the second trench.

One aspect of the present disclosure is to provide a method of manufacturing a recessed access device. The method includes the following operations. A first trench is formed in a substrate. A sacrificial layer is formed in a bottom of the first trench, in which a sidewall of the first trench above the sacrificial layer is exposed from the first trench. The sidewall of the first trench is oxidized to form a first gate oxide layer. The first gate oxide layer and the sacrificial layer are removed to form a second trench. An inner surface of the second trench is oxidized to form a second gate oxide layer within the substrate. A gate layer is formed in a bottom of the second trench. A source/drain region is formed in the substrate and adjacent to the gate layer.

According to some embodiments of the present disclosure, a material of the sacrificial layer is nitride.

According to some embodiments of the present disclosure, the method further includes a dielectric layer is formed on the gate layer in the second trench, after the gate layer is formed in the bottom of the second trench.

One aspect of the present disclosure is to provide a recessed access device. The recessed access device includes a substrate, a trench, a gate oxide layer, a gate layer, and a source/drain region. The trench is embedded in the substrate. The trench includes an upper portion and a lower portion, the upper portion has a substantially vertical sidewall and a first curved sidewall extending from a bottom edge of the substantially vertical sidewall to a top edge of the lower portion, and the first curved sidewall of the upper portion and a sidewall of the lower portion form an obtuse angle. The gate oxide layer is disposed in the trench. The gate oxide layer has a first portion on the substantially vertical sidewall, a second portion on the sidewall of the lower portion, and a connection portion on the first curved sidewall and between the first portion and the second portion. A maximum thickness of the connection portion is greater than a first thickness of the first portion and a second thickness of the second portion. The gate layer is disposed in a bottom of the trench to cover the second portion and the connection portion of the gate oxide layer. The source/drain region is disposed in the substrate and adjacent to the gate layer.

According to some embodiments of the present disclosure, the first thickness of the first portion is substantially the same as the second thickness of the second portion.

According to some embodiments of the present disclosure, the first thickness of the first portion is different from the second thickness of the second portion.

According to some embodiments of the present disclosure, the connection portion has a top surface substantially coplanar with a top surface of the gate layer.

According to some embodiments of the present disclosure, the connection portion includes a second curved sidewall facing toward the gate layer, and the second curved sidewall extends from a top edge of the gate layer to a top edge of the second portion of the gate oxide layer.

According to some embodiments of the present disclosure, the source/drain region is adjacent to the connection portion, the first portion, and a portion of the second portion of the gate oxide layer.

According to some embodiments of the present disclosure, the recessed access device further includes a dielectric layer disposed on the gate layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
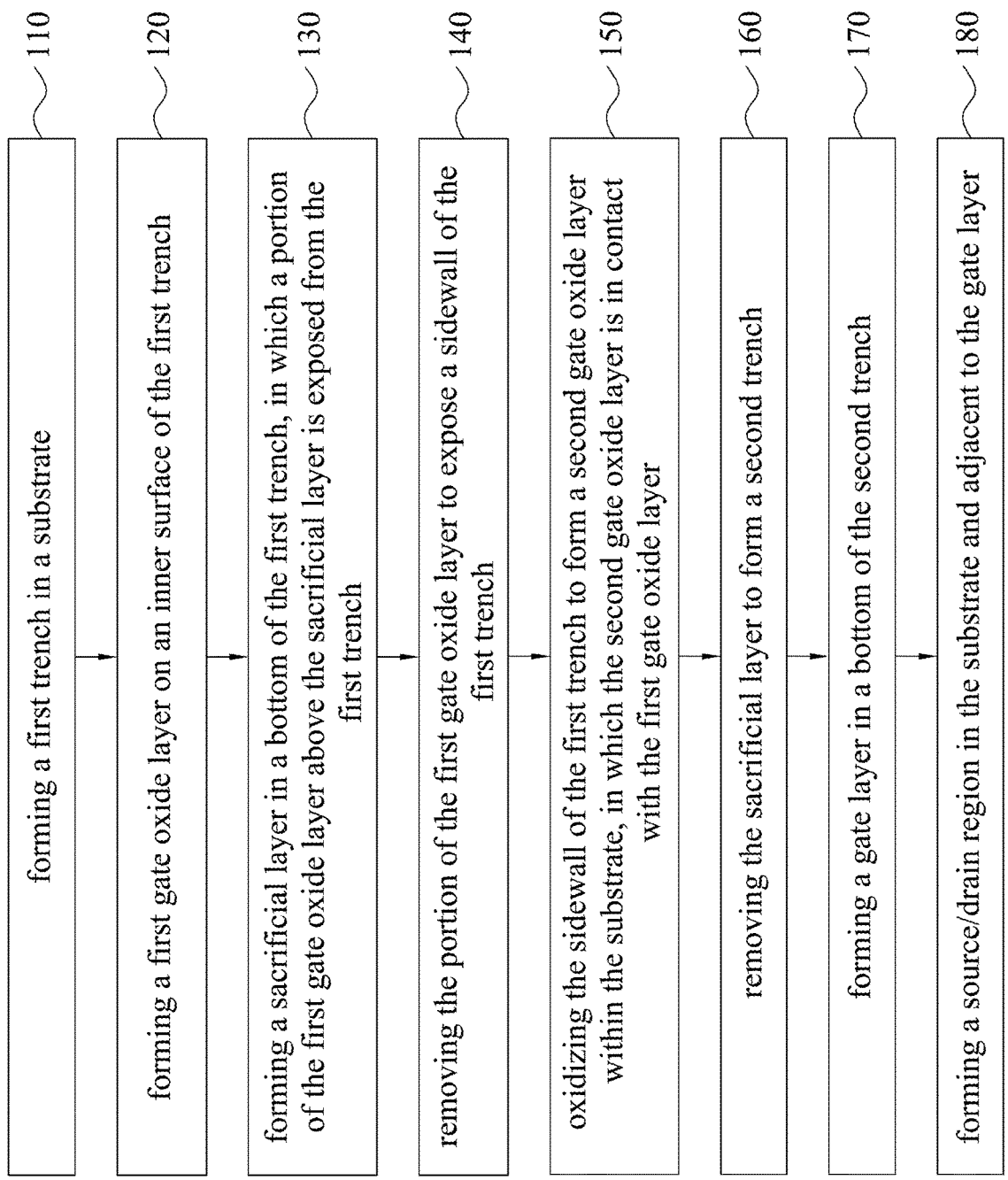
FIG. 1 is a flowchart of a method of manufacturing a recessed access device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In metal gate recessed access devices (RADs), gate induced drain leakage (GIDL) is one of the most important issues on the memory refresh performance of a memory device. GIDL may occur in the overlap region between a gate layer and a source/drain region in the semiconductor device, and this is because of a higher electric field under device operation. GIDL may be avoided by manufacturing a RAD structure with a thicker gate oxide layer to separate the gate layer from the source/drain. Therefore, the leakage current could be avoided. However, a cross-section of the gate layer would also be reduced by the thicker gate oxide layer, thereby reducing a drive current of the device. Therefore, the thicker gate oxide layer could avoid GIDL, but the ability to control the gate layer would be worse because of the reduction of the drive current of the device.

The present disclosure provides a recessed access device which could not only improve the GIDL problem as mentioned above, but also not to affect the ability to control the gate layer of the recessed access device. The present disclosure also provides methods of manufacturing the recessed access device. Embodiments of methods of manufacturing the recessed access device will be described in detail below.

FIG. 1 is a flowchart of a method 100 of manufacturing a recessed access device in accordance with some embodiments of the present disclosure. Operation 110, a first trench is formed in a substrate. The method continues with operation 120 in which a first gate oxide layer is formed on an inner surface of the first trench. Operation 130, a sacrificial layer is formed in a bottom of the first trench, in which a portion of the first gate oxide layer above the sacrificial layer is exposed from the first trench. The method continues with operation 140 in which the portion of the first gate oxide layer is removed to expose a sidewall of the first trench. Operation 150, the sidewall of the first trench is oxidized to form a second gate oxide layer within the substrate, in which the second gate oxide layer is in contact with the first gate oxide layer. The method continues with operation 160 in which the sacrificial layer is removed to form a second trench. Operation 170, a gate layer is formed in a bottom of the second trench. The method continues with operation 180 in which a source/drain region is formed in the substrate and adjacent to the gate layer.

FIG. 2A to FIG. 2J are cross-sectional views of a method of manufacturing a recessed access device 2000 at various stages in accordance with some embodiments of the present disclosure.

Figure 2B:
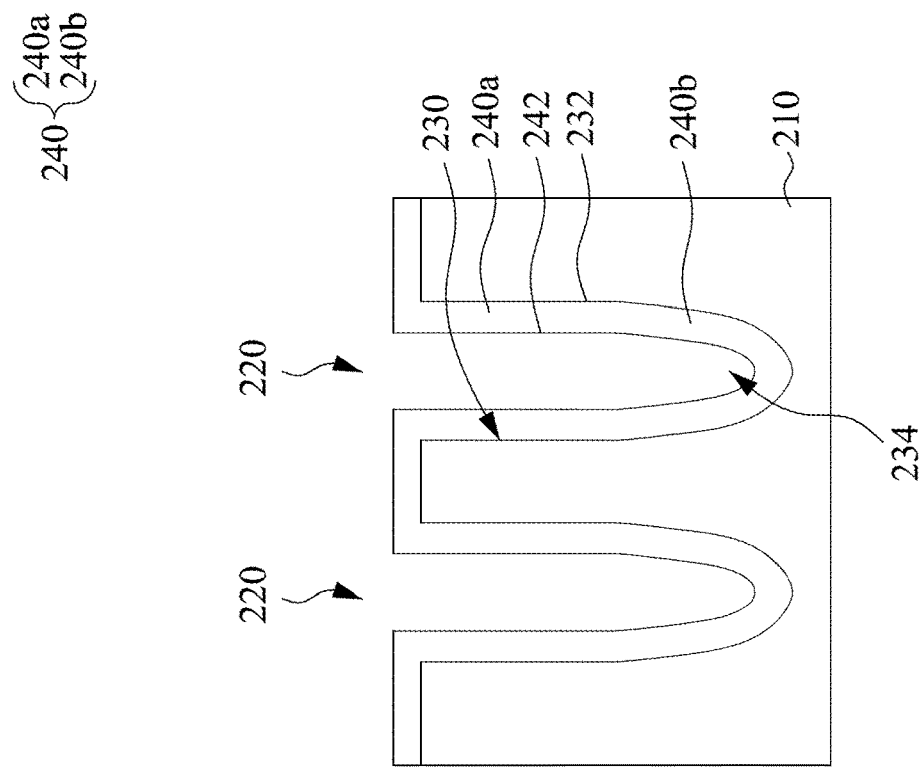
FIG. 2A to FIG. 2J are cross-sectional views of a method of manufacturing a recessed access device at various stages in accordance with some embodiments of the present disclosure.
Figure 2A:
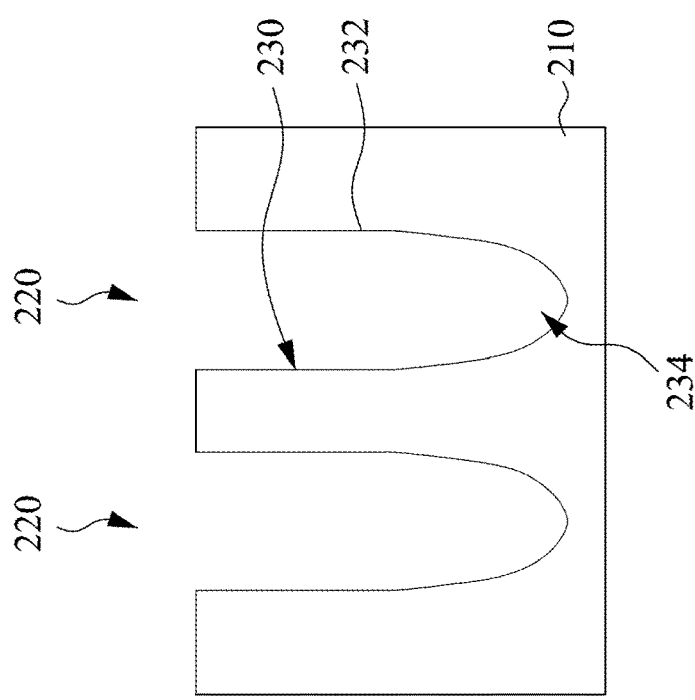

Please refer to FIG. 2A, a first trench 220 is formed in a substrate 210 (the operation 110 of FIG. 1). In some embodiments, the substrate 210 may be, for example, a bulk single crystal silicon substrate, a silicon-on-insulator (SOI) substrate, or some other suitable semiconductor substrate. In some embodiments, the substrate 210 is made of silicon (Si), germanium (Ge), silicon carbide (SiC), gallium arsenide (GaAs), and/or a combination thereof or other suitable semiconductor substrates.

Please refer to FIG. 2A and FIG. 2B, a first gate oxide layer 240 is formed on an inner surface 230 of the first trench 220 (the operation 120 of FIG. 1). Specifically, the first gate oxide layer 240 has a top portion 240a and a bottom portion 240b, and the top portion 240a is conformally formed on a sidewall 232 of the first trench 220, and the bottom portion 240b is conformally formed in a bottom 234 of the first trench 220. In some embodiments, the material of the first gate oxide layer 240 may be silicon oxide, such as tetraethylorthosilicate (TEOS), silicon dioxide (SiO$_2$), or silicon oxynitride (SiON), or combinations thereof, but not limited thereto.

Still referring to FIG. 2B, in some embodiments, the first gate oxide layer 240 is performed by a deposition process. In some embodiments, the first gate oxide layers 240 can be formed by deposition methods such as chemical vapor deposition (CVD), atomic layer deposition (ALD), physical vapor deposition (PVD), or other suitable deposition processes. In alternative embodiments, the first gate oxide layer 240 is formed by performing a thermal oxidation process to oxidize the inner surface 230 of the first trench 220. More specifically, the first gate oxide layer 240 is thermally grown on the inner surface 230 and in the substrate 210.

Figure 2D:
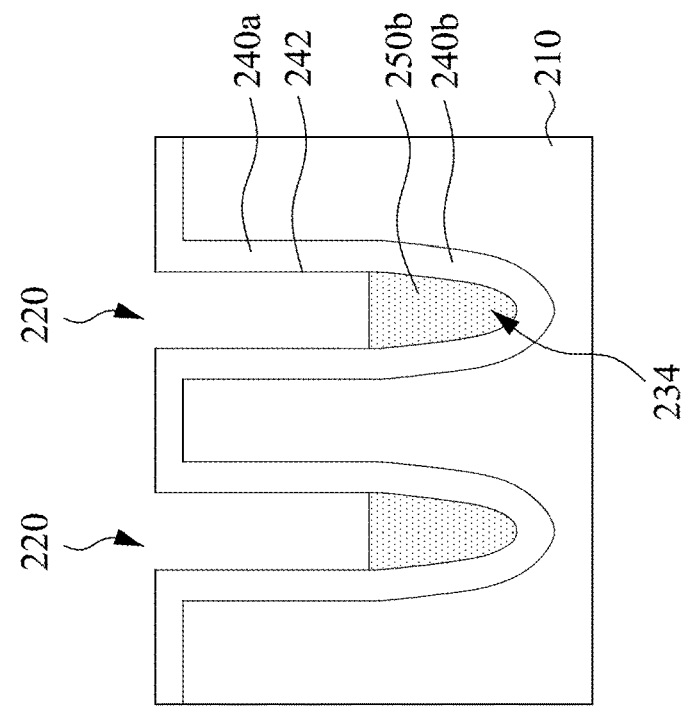
Figure 2C:
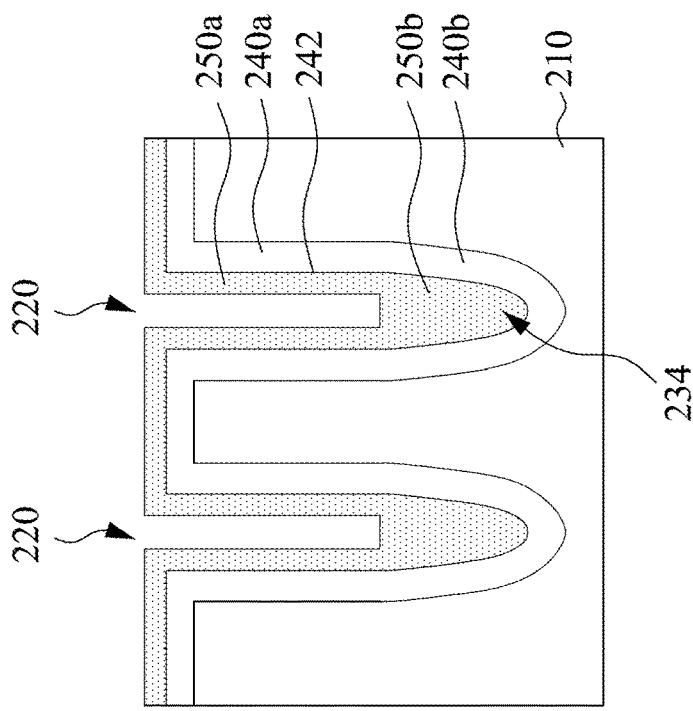

Please refer to FIG. 2B to FIG. 2D, a bottom portion 250b of a sacrificial layer 250 is formed in the bottom 234 of the first trench 220, in which the top portion 240a of the first gate oxide layer 240 above the bottom portion 250b of the sacrificial layer 250 is exposed from the first trench 220 (the operation 130 of FIG. 1). As shown in FIG. 2B and FIG. 2C, the sacrificial layer 250 is formed on the first gate oxide layer 240. In detail, the sacrificial layer 250 has a top portion 250a and a bottom portion 250b. Specifically, the top portion 250a is formed on a sidewall 242 of the top portion 240a of the first gate oxide layer 240, and the bottom portion 250b is formed on the bottom portion 240b of the first gate oxide layer 240 in the bottom 234 of the first trench 220. In some embodiments, the material of the sacrificial layer 250 may be nitride, such as silicon nitride, but not limited thereto. In some embodiments, the sacrificial layer 250 is formed by deposition methods such as chemical vapor deposition (CVD), atomic layer deposition (ALD), physical vapor deposition (PVD), or other suitable deposition processes. In some embodiments, the material of the first gate oxide layer 240 is different from the material of the sacrificial layer 250.

Still referring to FIG. 2C and FIG. 2D, the top portion 250a of the sacrificial layer 250 is removed, and the sidewall 242 of the first gate oxide layer 240 above the bottom portion 250b of the sacrificial layer 250 is exposed from the first trench 220. In some embodiments, the top portion 250a is removed by an etch back process, such as wet etching.

Figure 2F:
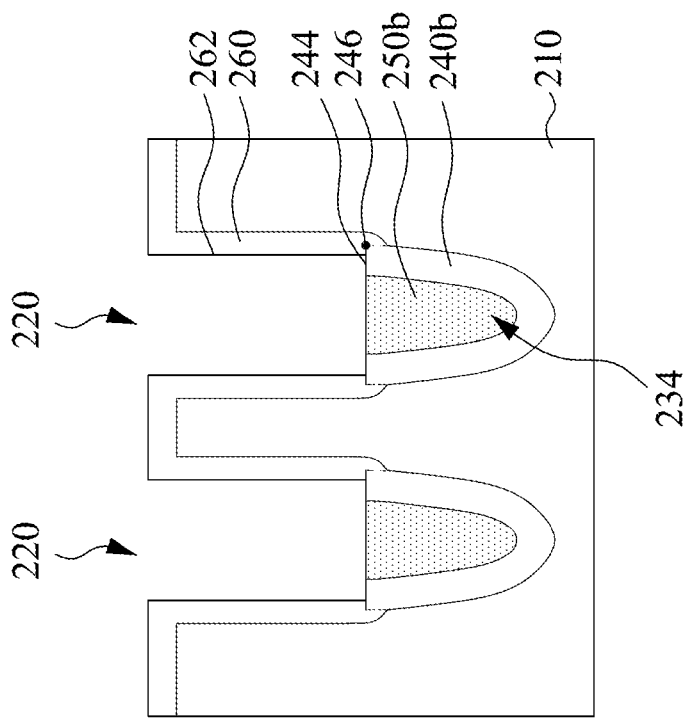
Figure 2E:
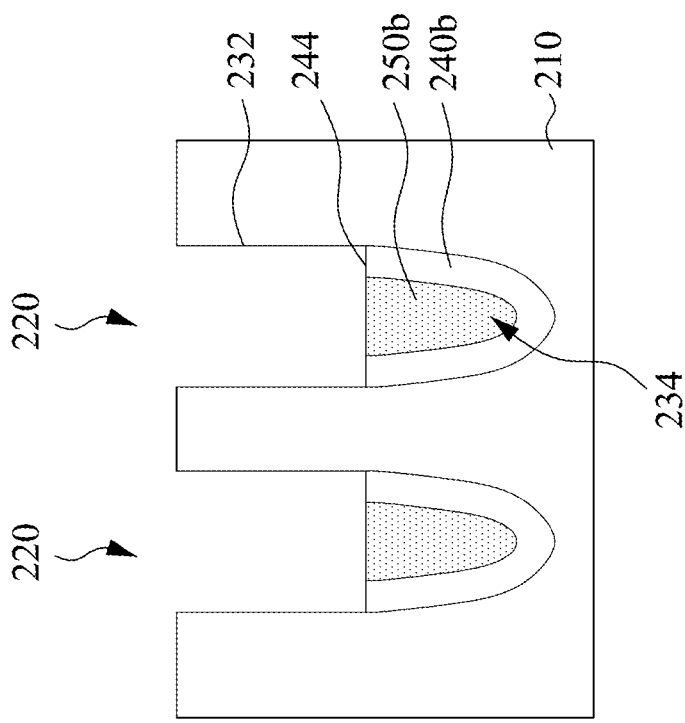

Please refer to FIG. 2D and FIG. 2E, the top portion 240a of the first gate oxide layer 240 is removed to expose the sidewall 232 of the first trench 220 (the operation 140 of FIG. 1). In detail, a top surface 244 of the bottom portion 240b of the first gate oxide layer 240 is also exposed. In some embodiments, the top portion 240a is removed by an etch back process, such as wet etching.

Please refer to FIG. 2E and FIG. 2F, the sidewall 232 of the first trench 220 is oxidized to form a second gate oxide layer 260 within the substrate 210, in which the second gate oxide layer 260 is in contact with the bottom portion 240b of the first gate oxide layer 240 (the operation 150 of FIG. 1). In detail, a top edge 246 of the bottom portion 240b of the first gate oxide layer 240 is in contact with and embedded in the second gate oxide layer 260. Specifically, the second gate oxide layer 260 is formed by a thermal oxidation process, and the second gate oxide layer 260 is thermally grown on the sidewall 232 and in the substrate 210. Therefore, the second gate oxide layer 260 has a sidewall 262, and the sidewall 262 is exposed from the first trench 220. It should be noticed that a portion of the top surface 244 is in contact with the second gate oxide layer 260, and a portion of the top surface 244 is still exposed. In some embodiments, a part of the bottom portion of the second gate oxide layer 260 is like a bird's beak shape which is adjacent to the bottom portion 250b of sacrificial layer 250. In some embodiments, the material of the second gate oxide layer 260 may be silicon oxide, such as tetraethylorthosilicate (TEOS), silicon dioxide ($SiO_2$), or silicon oxynitride (SiON), or combinations thereof, but not limited thereto. In some embodiments, the material of the second gate oxide layer 260 is the same as the material of the first gate oxide layer 240.

Figure 2H:
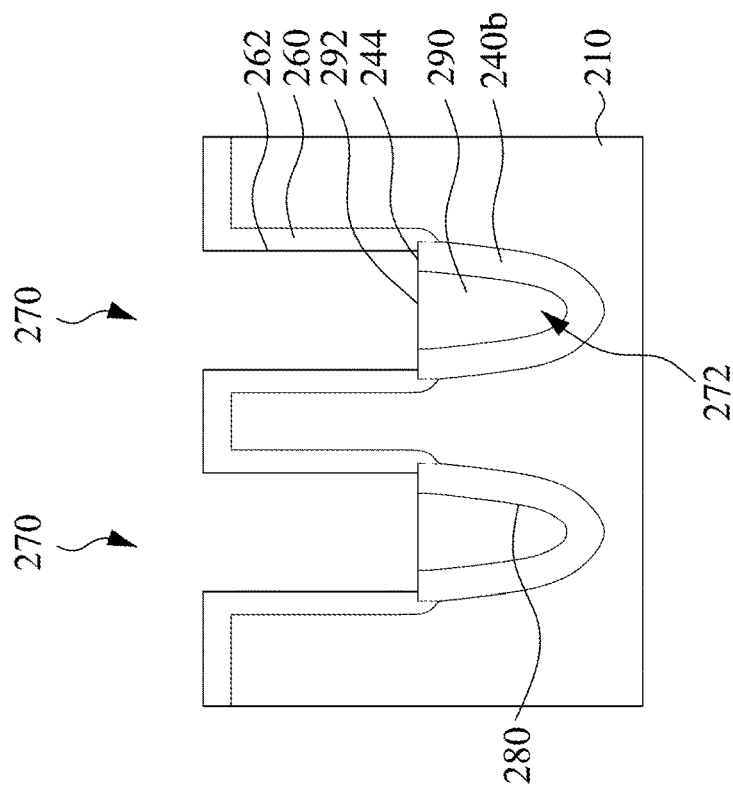
Figure 2G:
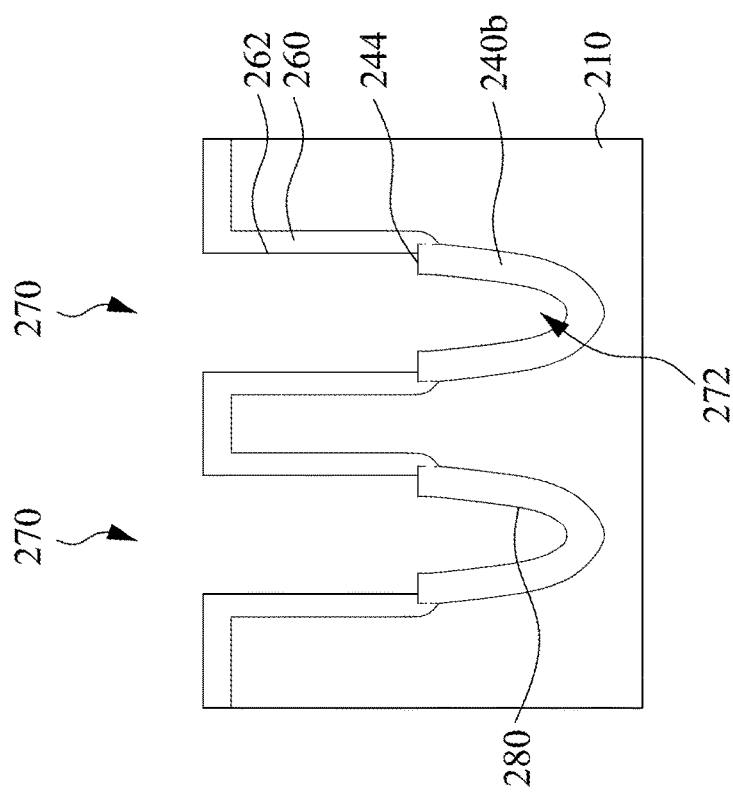

Please refer to FIG. 2F and FIG. 2G, the bottom portion 250b of the sacrificial layer 250 is removed to form a second trench 270 (the operation 160 of FIG. 1). Specifically, an inner surface 280 of the bottom portion 240b of the first gate oxide layer 240 is exposed from the second trench 270. More specifically, the second trench 270 has the sidewall 262 of the second gate oxide layer 260 and the inner surface 280 of the second trench 270. In some embodiments, the bottom portion 250b of the sacrificial layer 250 is removed by an etching process, such as wet etching, but not limited thereto.

Please refer to FIG. 2G and FIG. 2H, a gate layer 290 is formed in the bottom 272 of the second trench 270 (the operation 170 of FIG. 1). In some embodiments, forming the gate layer 290 in the bottom 272 of the second trench includes the following operations. Specifically, a gate layer is formed on the bottom portion 240b of first gate oxide layer 240 and the second gate oxide layer 260, and then an etch back process is performed to remove a portion of the gate layer to form the gate layer 290. More specifically, in some embodiments, the gate layer 290 has a top surface 292 substantially coplanar with the top surface 244 of the bottom portion 240b of the first gate oxide layer 240. In some embodiments, the material of the gate layer 290 may be a conductive material, and the conductive material can be selected from the group of amorphous silicon, polycrystalline silicon, polycrystalline silicon germanium, metal nitride, metal silicide, metal oxide and other suitable metal. In some embodiments, the gate layer 290 is formed by deposition methods such as chemical vapor deposition (CVD), atomic layer deposition (ALD), physical vapor deposition (PVD), or other suitable deposition processes.

Figure 2J:
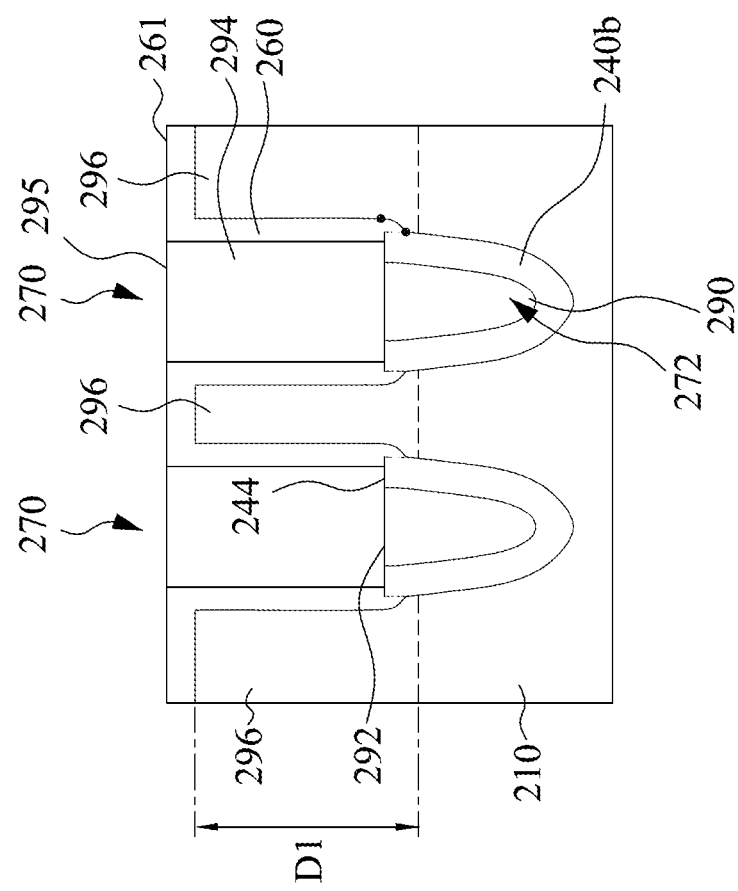
Figure 2I:
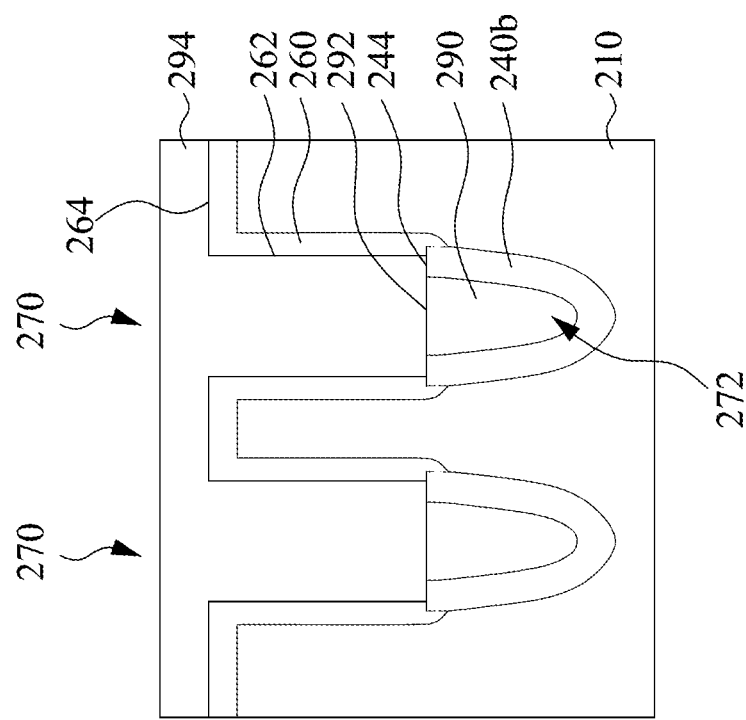

Please refer to FIG. 2H and FIG. 2I, a dielectric layer 294 is formed on the gate layer 290 in the second trench 270. Specifically, the dielectric layer 294 covers the top surface 292 of the gate layer 290 and the sidewall 262 of the second gate oxide layer 260. In some embodiments, the dielectric layer 294 also covers a top surface 264 of the second gate oxide layer 260. In some embodiments, the dielectric layer 294 includes silicon dioxide, silicon nitride, silicon oxynitride, tetraethoxysilane (TEOS) oxide, a low-k material and/or a combination thereof or other suitable dielectric material. In some embodiments, the dielectric layer 294 is formed by deposition methods such as chemical vapor deposition (CVD), atomic layer deposition (ALD), physical vapor deposition (PVD), or other suitable deposition processes.

Please refer to FIG. 2I and FIG. 2J, a source/drain region 296 is formed in the substrate 210 and adjacent to the gate layer 290. In some embodiments, a planarization process, such as chemical mechanical polishing (CMP), is performed before forming the source/drain region 296. In detail, a top surface 295 of the dielectric layer 294 and a top surface 261 of the second gate oxide layer 260 are exposed by performing the planarization process. In some embodiments, the source/drain region 296 is formed by performing an ion implantation process, but not limited thereto. Specifically, the source/drain region 296 has a doping depth D1 in the substrate 210. In some embodiments, the material of the source/drain region 296 includes a doped semiconductor material such as silicon or germanium, a compound-doped semiconductor material such as gallium arsenide, indium arsenide, indium phosphide, or silicon carbide, or other suitable one or more of the materials. It is to be understood that the doping depth D1 and a doping concentration of the source/drain region 296 can be adjusted.

Figure 2K:
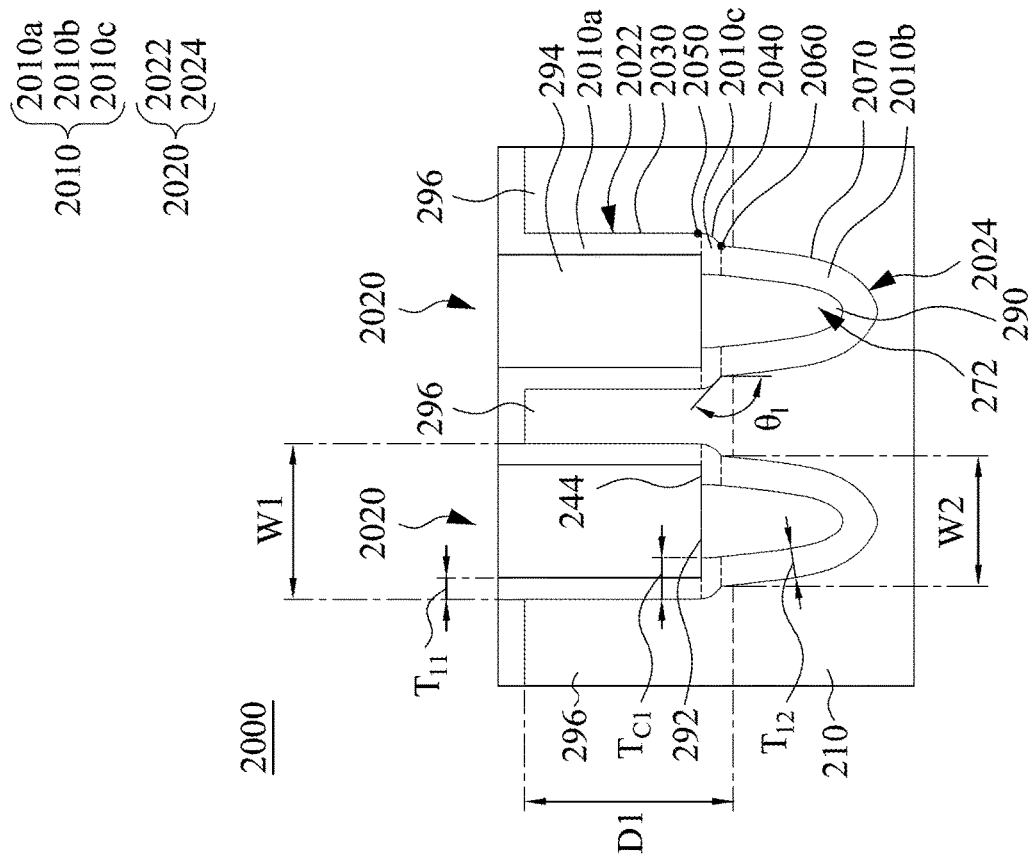
FIG. 2K is a cross-sectional view of a recessed access device in accordance with some embodiments of the present disclosure.

Please refer to FIG. 2K. FIG. 2K is a cross-sectional view of a recessed access device 2000 in accordance with some embodiments of the present disclosure. The recessed access device 2000 includes a substrate 210, a trench 2020, a gate oxide layer 2010, a gate layer 290, and a source/drain region 296. The trench 2020 is in the substrate 210. The trench 2020 includes an upper portion 2022 and a lower portion 2024. Specifically, the upper portion 2022 has a substantially vertical sidewall 2030 and a first curved sidewall 2040 extending from a bottom edge 2050 of the substantially vertical sidewall 2030 to a top edge 2060 of the lower portion 2024. The first curved sidewall 2040 of the upper portion 2022 and a sidewall 2070 of the lower portion 2024 of the trench 2020 form an obtuse angle $\theta_1$. More specifically, a maximum width W1 of the upper portion 2022 of the trench 2020 is greater than a maximum width W2 of the lower portion 2024 of the trench 2020.

Still refer to FIG. 2K. The gate oxide layer 2010 is disposed in the trench 2020. Specifically, the gate oxide layer 2010 has a first portion 2010a on the substantially vertical sidewall 2030, a second portion 2010b on the sidewall 2070 of the lower portion 2024, and a connection portion 2010c on the first curved sidewall 2040 and between the first portion 2010a and the second portion 2010b. A maximum thickness $T_{C1}$ of the connection portion 2010c is greater than a first thickness $T_{11}$ of the first portion 2010a and a second thickness $T_{12}$ of the second portion 2010b of the gate oxide layer 2010. The gate layer 290 is disposed in the bottom 272 of the trench 2020 to cover the second portion 2010b and the connection portion 2010c of the gate oxide layer 2010. The source/drain region 296 is disposed in the substrate 210 and adjacent to a portion of the gate layer 290. It should be noticed that the connection portion 2010c of the gate oxide layer 2010 has the maximum thickness $T_{C1}$ greater than the first thickness $T_{11}$ and the second thickness $T_{12}$. Therefore, the present disclosure can improve the GIDL problem and would not affect the ability to control the gate layer 290 of the recessed access device 2000.

The further detail of the recessed access device 2000 in FIG. 2K will be described below. In some embodiments, the first thickness $T_{11}$ of the first portion 2010a of the gate oxide layer 2010 is different from the second thickness $T_{12}$ of the second portion 2010b of the gate oxide layer 2010. For example, the first thickness $T_{11}$ is greater than the second thickness $T_{12}$, or the second thickness $T_{12}$ is greater than the first thickness $T_{11}$. In some embodiments, the first thickness $T_{11}$ of the first portion 2010a of the gate oxide layer 2010 is substantially the same as the second thickness $T_{12}$ of the second portion 2010b of the gate oxide layer 2010. In some embodiments, the connection portion 2010c of the gate oxide layer 2010 has a top surface 244 substantially coplanar with a top surface 292 of the gate layer 290. In some embodiments, the source/drain region 296 is adjacent to the connection portion 2010c, the first portion 2010a, and a portion of the second portion 2010b of the gate oxide layer 2010. In some embodiments, the recessed access device 2000 includes the dielectric layer 294 disposed on the gate layer 290.

Figure 3:
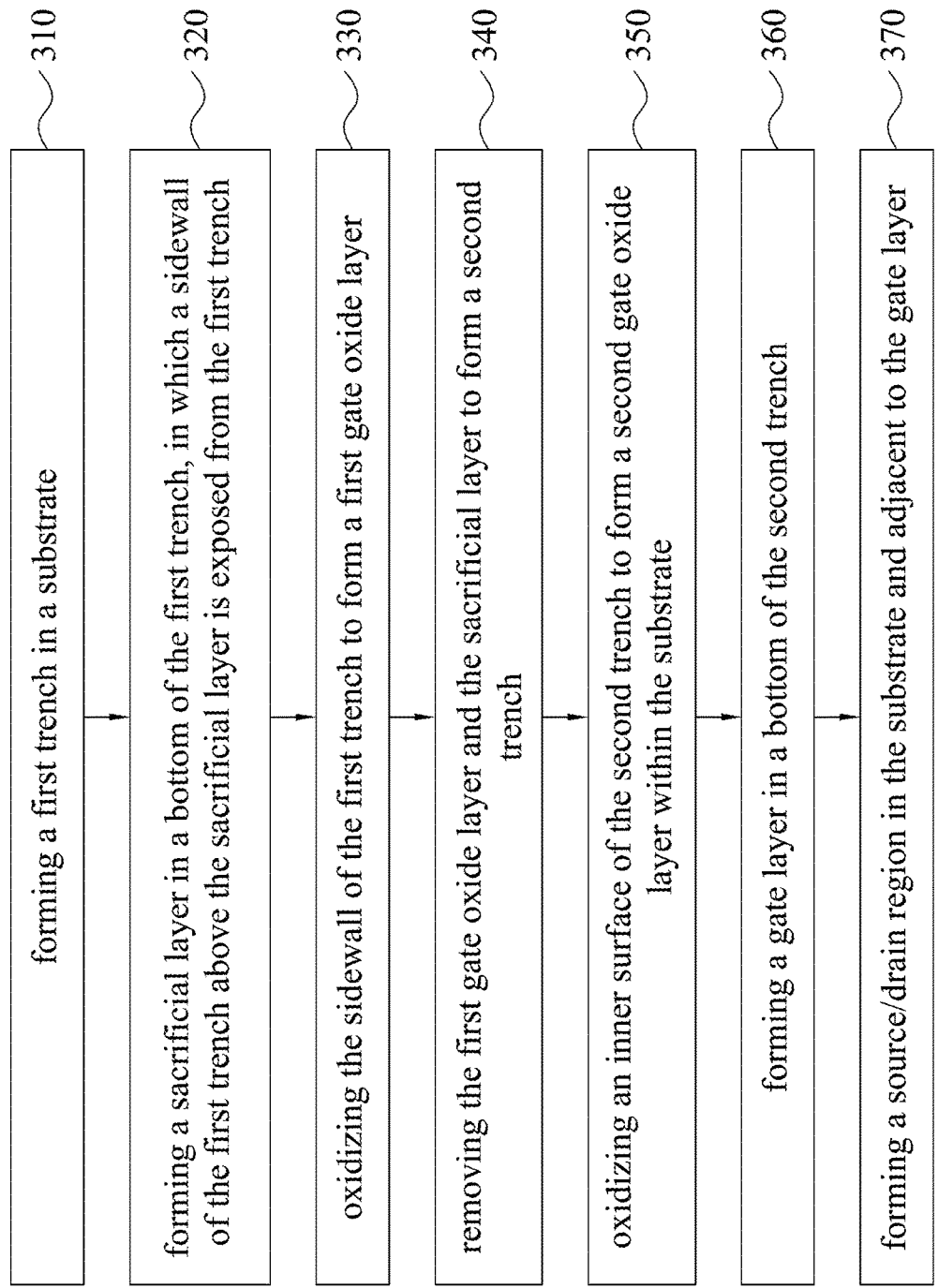
FIG. 3 is a flowchart of a method of manufacturing a recessed access device in accordance with some embodiments of the present disclosure.

FIG. 3 is a flowchart of a method of manufacturing a recessed access device in accordance with some embodiments of the present disclosure. Operation 310, a first trench is formed in a substrate. The method continues with operation 320 in which a sacrificial layer is formed in a bottom of the first trench, in which a sidewall of the first trench above the sacrificial layer is exposed from the first trench. Operation 330, the sidewall of the first trench is oxidized to form a first gate oxide layer. The method continues with operation 340 in which the first gate oxide layer and the sacrificial layer are removed to form a second trench. Operation 350, an inner surface of the second trench is oxidized to form a second gate oxide layer within the substrate. The method continues with operation 360 in which a gate layer is formed in a bottom of the second trench. Operation 370, a source/drain region is formed in the substrate and adjacent to the gate layer.

FIG. 4A to FIG. 4H are cross-sectional views of a method of manufacturing a recessed access device 4000 at various stages in accordance with some embodiments of the present disclosure.

Figure 4B:
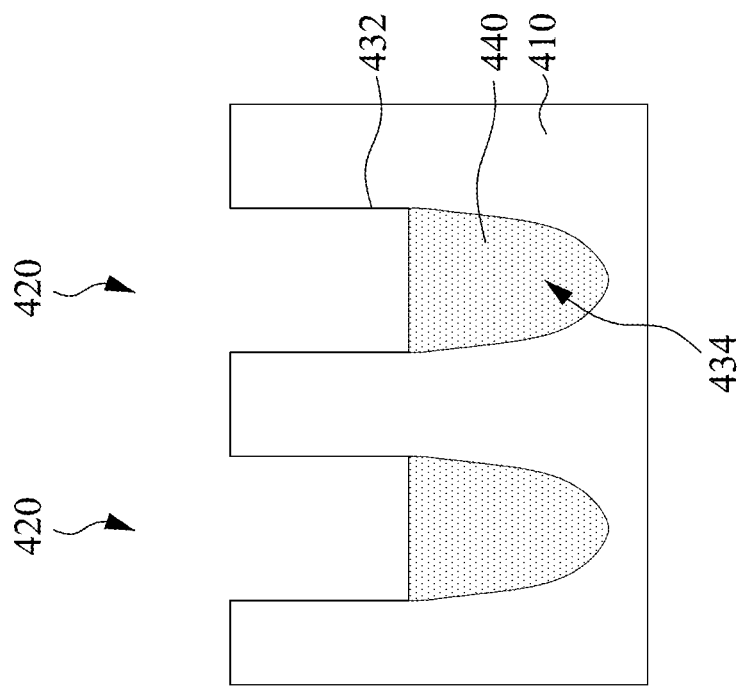
FIG. 4A to FIG. 4H are cross-sectional views of a method of manufacturing a recessed access device at various stages in accordance with some embodiments of the present disclosure.
Figure 4A:
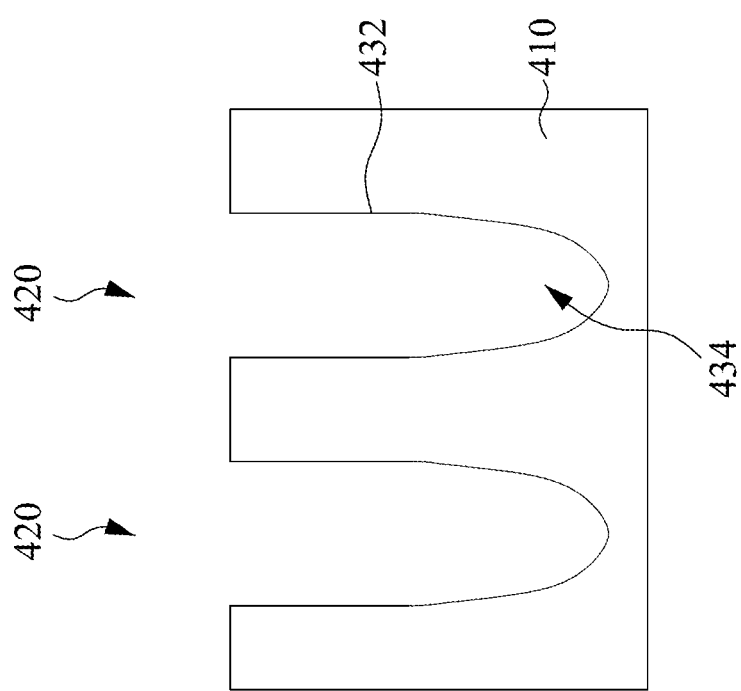

Please refer to FIG. 4A, a first trench 420 is formed in a substrate 410 (the operation 310 in FIG. 3). The material of the substrate 410 can be the same as the substrate 210 as mentioned in FIG. 2A, and the details thereof are not repeatedly described.

Please refer to FIG. 4A and FIG. 4B, a sacrificial layer 440 is formed in a bottom 434 of the first trench 420, in which the sidewall 432 of the first trench 420 above the sacrificial layer 440 is exposed from the first trench 420 (the operation 320 in FIG. 3). In some embodiments, forming the sacrificial layer 440 in the bottom 434 of the first trench 420 includes the following operations. A sacrificial layer is formed in the first trench 420, and then an etch back process is performed to remove a portion of the sacrificial layer to form the sacrificial layer 440. After the etch back process is performed, the sacrificial layer 440 is formed in the bottom 434 of the first trench 420, and the sidewall 432 of the first trench 420 is exposed, as shown in FIG. 4B. The material of the sacrificial layer 440 and the forming method thereof can be the same as the material and the forming method of sacrificial layer 250 as mentioned in FIG. 2C, and the details thereof are not repeatedly described.

Figure 4D:
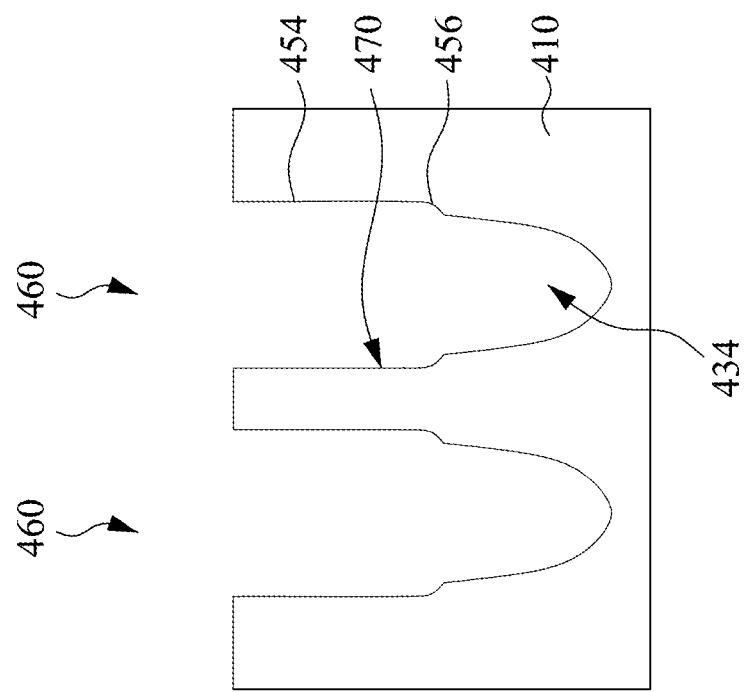
Figure 4C:
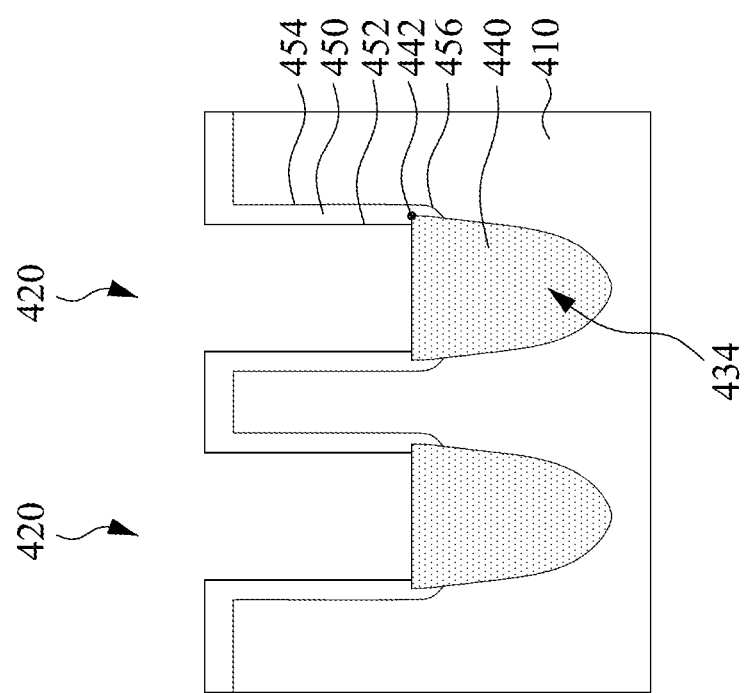

Please refer to FIG. 4B and FIG. 4C, the sidewall 432 of the first trench 420 is oxidized to form a first gate oxide layer 450 (the operation 330 in FIG. 3). Specifically, the first gate oxide layer 450 is formed by performing a thermal oxidation process, and the first gate oxide layer 450 is thermally grown on the sidewall 432 of the first trench 420 and in the substrate 410. More specifically, the first gate oxide layer 450 has a sidewall 452 and a sidewall 454, in which the sidewall 452 of the first gate oxide layer 450 is exposed from the first trench 420, and the sidewall 454 of the first gate oxide layer 450 is in contact with the substrate 410. In detail, a bottom edge of the sidewall 454 has a curved sidewall 456, as shown in FIG. 4C. It should be understood that a top edge 442 of the sacrificial layer 440 is embedded into a bottom portion of the first gate oxide layer 450, after the sidewall 432 of the first trench 420 is oxidized. The material of the first gate oxide layer 450 may be silicon oxide, such as tetraethylorthosilicate (TEOS), silicon dioxide ($SiO_2$), or silicon oxynitride (SiON), or combinations thereof, but not limited thereto.

Please refer to FIG. 4C and FIG. 4D, the first gate oxide layer 450 and the sacrificial layer 440 are removed to form a second trench 460 (the operation 340 in FIG. 3). In some embodiments, removing the first gate oxide layer 450 and the sacrificial layer 440 includes two etching processes, and the etchants in such two etching process are different.

Figures 4E, 4F:
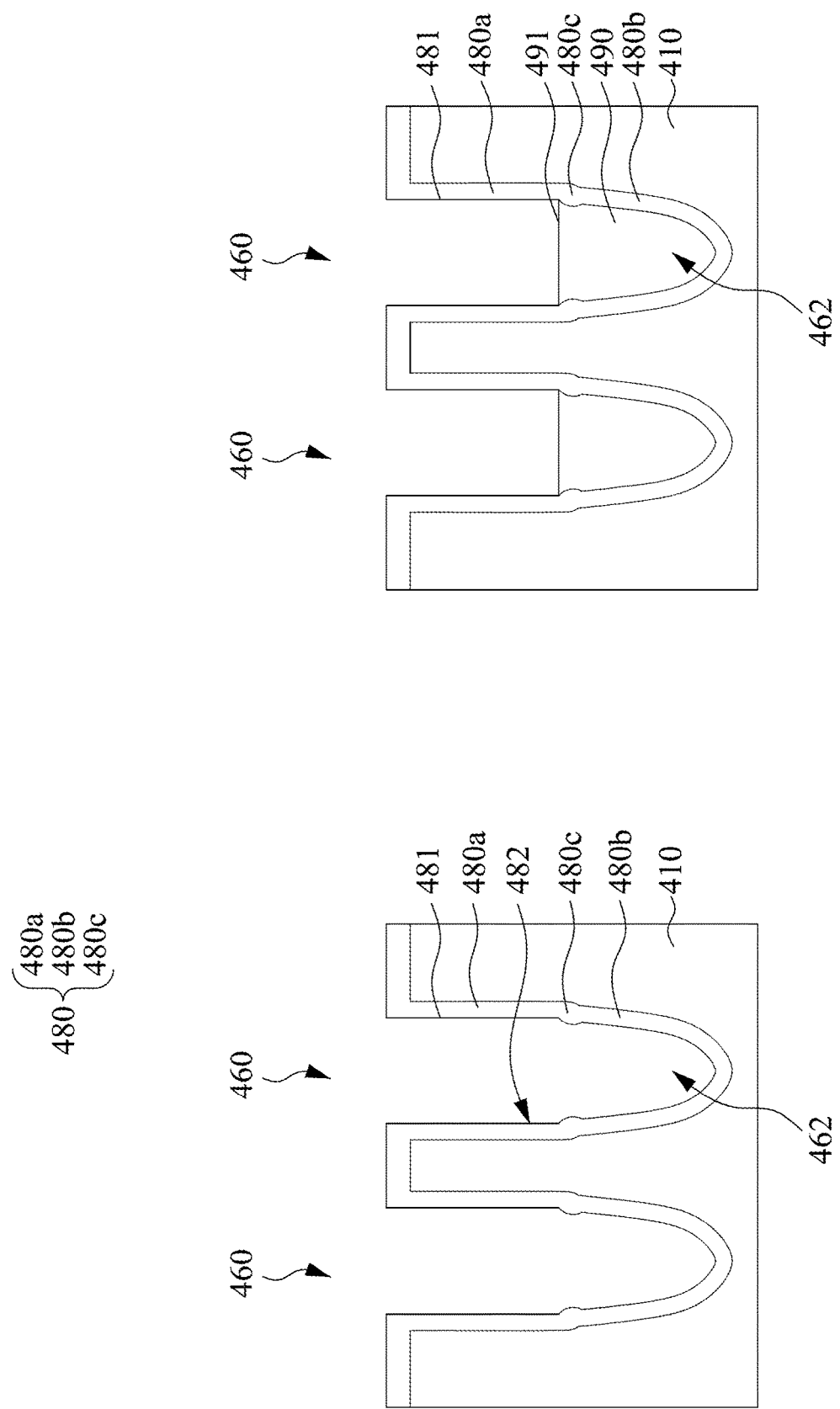

Please refer to FIG. 4D and FIG. 4E, an inner surface 470 of the second trench 460 is oxidized to form a second gate oxide layer 480 within the substrate 410 (the operation 350 in FIG. 3). Specifically, the second gate oxide layer 480 is formed by performing a thermal oxidation process, and the second gate oxide layer 480 is thermally grown on the inner surface 470 and in the substrate 410. Therefore, an inner surface 482 of the second gate oxide layer 480 is formed and exposed from the second trench 460. In detail, the second gate oxide layer 480 includes a first portion 480a, a second portion 480b, and a connection portion 480c, in which the first portion 480a is formed on the sidewall 454, the second portion 480b is formed in the bottom 434, and the connection portion 480c is formed on the curved sidewall 456.

Please refer to FIG. 4E and FIG. 4F, a gate layer 490 is formed in a bottom 462 of the second trench 460 (the operation 360 in FIG. 3). In some embodiments, forming the gate layer 490 in the bottom 462 of the second trench 460 includes the following operations. A gate layer is formed on the first portion 480a, the second portion 480b, and the connection portion 480c of the second gate oxide layer 480. Then, an etch back process is performed to remove a portion of the gate layer, thereby exposing a sidewall 481 of the first portion 480a of the second gate oxide layer 480. After the etch back process is performed, the gate layer 490 is formed in the second trench 460. The material of the gate layer 490 and the forming method thereof can be the same as the material and the forming method of the gate layer 260 as mentioned in FIG. 2H, and the details thereof are not repeatedly described.

Figure 4H:
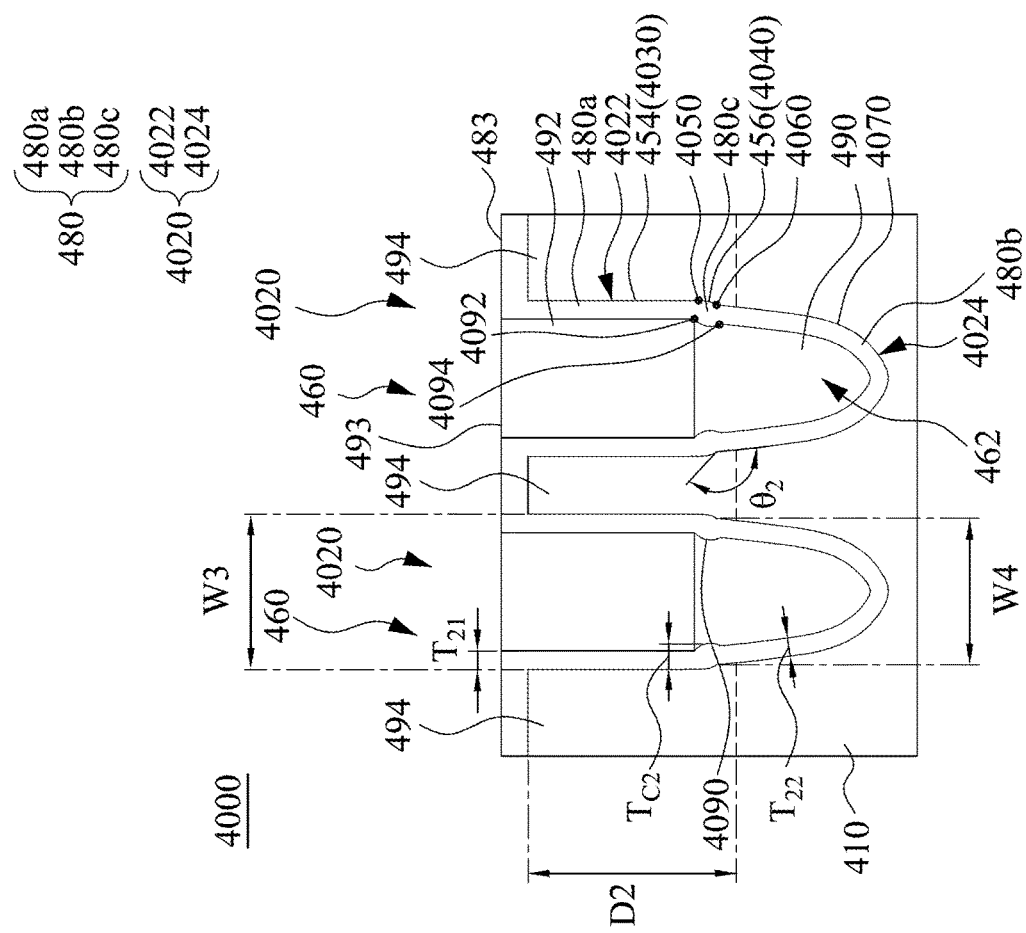
Figure 4G:
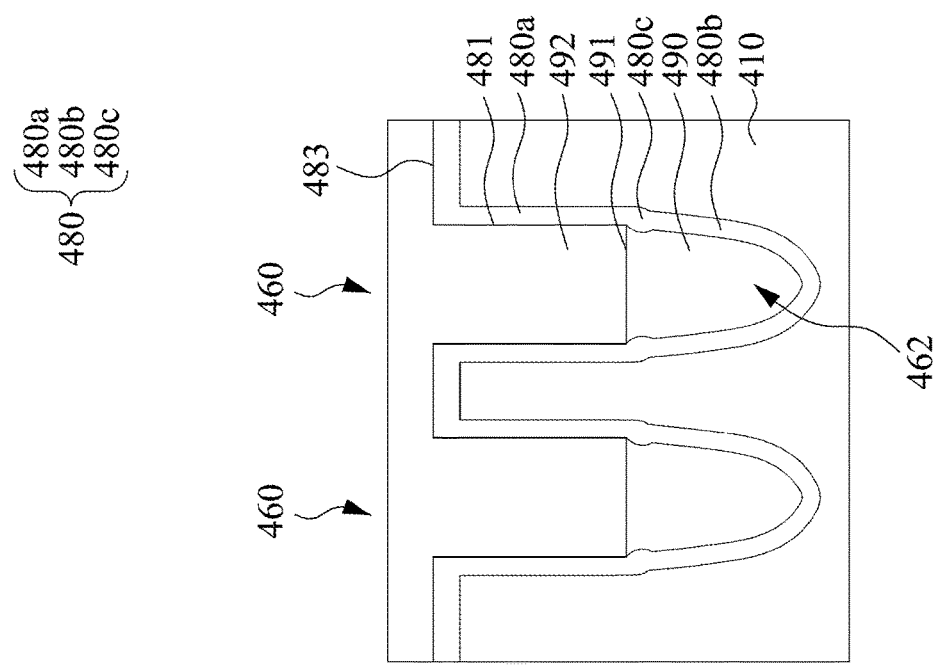

Please refer to FIG. 4F and FIG. 4G, a dielectric layer 492 is formed on the gate layer 490 in the second trench 460. Specifically, the dielectric layer 492 covers a top surface 491 of the gate layer 490 and the sidewall 481 of the first portion 480a of the second gate oxide layer 480. In some embodiments, the dielectric layer 492 also covers a top surface 483 of the second gate oxide layer 480. The material of the dielectric layer 492 and the forming method thereof can be the same as the material and the forming method of the dielectric layer 294 as mentioned in FIG. 2I, and the details thereof are not repeatedly described.

Please refer to FIG. 4G and FIG. 4H, a source/drain region 494 is formed in the substrate 410 and adjacent to the gate layer 490 (the operation 370 in FIG. 3). In some embodiments, a planarization process, such as CMP, is performed before forming the source/drain region 494. In detail, a top surface 493 of the dielectric layer 492 and the top surface 483 of the second gate oxide layer 480 are exposed by performing the planarization process. In some embodiments, the source/drain region 494 is formed by performing an ion implantation process, but not limited thereto. Specifically, the source/drain region 494 has a doping depth D2 in the substrate 410. The material of the source/drain region 494 can be the same as that of the source/drain region 296 as mentioned in FIG. 2J. It is to be understood that the doping depth D2 and a doping concentration of the source/drain region 494 can be adjusted.

Please refer to FIG. 4H again. FIG. 4H is a cross-sectional view of a recessed access device 4000 in accordance with some embodiments of the present disclosure. The recessed access device 4000 includes a substrate 410, a trench 4020, a gate oxide layer 480, a gate layer 490, and a source/drain region 494. The trench 4020 is in the substrate 410. The trench 4020 includes an upper portion 4022 and a lower portion 4024. Specifically, the upper portion 4022 of the trench 4020 has a substantially vertical sidewall 4030 and a first curved sidewall 4040 extending from a bottom edge 4050 of the substantially vertical sidewall 4030 to a top edge 4060 of a sidewall 4070 of the lower portion 4024 of the trench 4020. The first curved sidewall 4040 of the upper portion 4022 of the trench 4020 and the sidewall 4070 of lower portion 4024 of the trench 4020 form an obtuse angle $\theta_2$. More specifically, a maximum width W3 of the upper portion 4022 of the trench 4020 is greater than a maximum width W4 of the lower portion 4024 the trench 4020.

Still refer to FIG. 4H. The gate oxide layer 480 is disposed in the trench 4020. The gate oxide layer 480 has a first portion 480a on the substantially vertical sidewall 4030 of the upper portion 4022 of the trench 4020, a second portion 480b on the sidewall 4070 of the lower portion 4024 of the trench 4020, and a connection portion 480c on the first curved sidewall 4040 of the upper portion 4022 of the trench 4020. The connection portion 480c is disposed between the first portion 480a and the second portion 480b of the gate oxide layer 480. A maximum thickness $T_{C2}$ of the connection portion 480c of the gate oxide layer 480 is greater than a first thickness $T_{21}$ of the first portion 480a of the gate oxide layer 480. The maximum thickness $T_{C2}$ of the connection portion 480c of the gate oxide layer 480 is greater than a second thickness $T_{22}$ of the second portion 480b of the gate oxide layer 480. The gate layer 490 is disposed in the bottom 462 of the trench 4020 to cover the second portion 480b and the connection portion 480c of the gate oxide layer 480. The source/drain region 496 is disposed in the substrate 410 and adjacent to the gate layer 490. It should be noticed that the connection portion 480c of the gate oxide layer 480 has the maximum thickness $T_{C2}$ greater than the first thickness $T_{21}$ and the second thickness $T_{22}$. Therefore, the present disclosure can improve the GIDL problem and would not affect the ability to control the gate layer 490 of the recessed access device 4000.

The further detail of the recessed access device 4000 in FIG. 4H will be described below. In some embodiments, the first thickness $T_{21}$ of the first portion 480a of the gate oxide layer 480 is substantially the same as the second thickness $T_{22}$ of the second portion 480b of the gate oxide layer 480. In some embodiments, the connection portion 480c of the gate oxide layer 480 includes a second curved sidewall 4090 facing toward the gate layer 490, and the second curved sidewall 4090 extends from a top edge 4092 of the gate layer 490 to a top edge 4094 of the second portion 480b of the gate oxide layer 480. In some embodiments, the source/drain region 494 is adjacent to the connection portion 480c, the first portion 480a, and a portion of the second portion 480b of the gate oxide layer 480. In some embodiments, the recessed access device 4000 includes the dielectric layer 492 disposed on the gate layer 490.

The present disclosure can improve the GIDL problem occurred in the overlap region between a gate layer and a source/drain region in the semiconductor device. The gate oxide layer of the recessed access device has the connection portion with the thickness greater than the thicknesses of other portions of the gate oxide layer. The greater thickness of the connection portion of the gate oxide layer would not affect the ability to control the gate layer of the recessed access device. This is because the size of the gate layer would not be reduced; therefore, the ability to control the gate would not be affected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a recessed access device, comprising:
   forming a first trench in a substrate;
   forming a first gate oxide layer on an inner surface of the first trench;
   forming a sacrificial layer in a bottom of the first trench, wherein a portion of the first gate oxide layer above the sacrificial layer is exposed from the first trench;
   removing the portion of the first gate oxide layer to expose a sidewall of the first trench;
   oxidizing the sidewall of the first trench to form a second gate oxide layer within the substrate, wherein the second gate oxide layer is in contact with the first gate oxide layer;
   removing the sacrificial layer to form a second trench;
   forming a gate layer in a bottom of the second trench; and
   forming a source/drain region in the substrate and adjacent to the gate layer.

2. The method of claim 1, wherein forming the first gate oxide layer on the inner surface of the first trench is performed by a deposition process.

3. The method of claim 1, wherein forming the first gate oxide layer on the inner surface of the first trench is performed by a thermal oxidation process to oxidize the inner surface of the first trench.

4. The method of claim 1, wherein forming the sacrificial layer in the bottom of the first trench comprises:
   forming the sacrificial layer on the first gate oxide layer; and
   performing an etch back process to remove a portion of the sacrificial layer.

5. The method of claim 1, wherein a material of the sacrificial layer is nitride.

6. The method of claim 1, further comprising forming a dielectric layer on the gate layer in the second trench, after forming the gate layer in the bottom of the second trench.

7. A method of manufacturing a recessed access device, comprising:
   forming a first trench in a substrate;
   forming a sacrificial layer in a bottom of the first trench, wherein a sidewall of the first trench above the sacrificial layer is exposed from the first trench;
   oxidizing the sidewall of the first trench to form a first gate oxide layer;
   removing the first gate oxide layer and the sacrificial layer to form a second trench;
   oxidizing an inner surface of the second trench to form a second gate oxide layer within the substrate;
   forming a gate layer in a bottom of the second trench; and
   forming a source/drain region in the substrate and adjacent to the gate layer.

8. The method of claim 7, wherein a material of the sacrificial layer is nitride.

9. The method of claim 7, further comprising forming a dielectric layer on the gate layer in the second trench, after forming the gate layer in the bottom of the second trench.

* * * * *